United States Patent

Hiromi

[11] Patent Number: 5,870,043
[45] Date of Patent: Feb. 9, 1999

[54] PLA DAC CIRCUIT EMPLOYING A TEST FUNCTION

[75] Inventor: Mitsuhisa Hiromi, Tokyo, Japan

[73] Assignee: NEC Corporation, Tokyo, Japan

[21] Appl. No.: 883,662

[22] Filed: Jun. 27, 1997

[30] Foreign Application Priority Data

Jun. 27, 1996 [JP] Japan .................................. 8-167666

[51] Int. Cl.⁶ .................................................. H03M 1/10
[52] U.S. Cl. .......................................... 341/120; 341/144
[58] Field of Search .................................... 341/120, 144

[56] References Cited

U.S. PATENT DOCUMENTS 5,583,502 12/1996 Takeuchi et al. .......................... 34/120

FOREIGN PATENT DOCUMENTS 57-203137 12/1982 Japan .
4-175676 6/1992 Japan .
7-46129 2/1995 Japan .

*Primary Examiner*—Howard L. Williams
*Attorney, Agent, or Firm*—Whitham, Curtis & Whitham

[57] ABSTRACT

In a PLA DAC circuit, it renders output of output-characteristic independent of method of establishment of PLA possible. Test terminal TEST is added to input terminal IN, causing combination of normal digital signal and test signal to judge at logical operation circuit. Switching circuit functioning during test is provided between PLA 2 and constant current source circuit, thus controlling the switching circuit by the logical operation circuit. Under the normal condition, it causes PLA 2 to function as ROM of the DAC circuit, while under the test condition, it causes the PLA 2 to perform through by operation of the switch circuit so that output of each of current sources I1–I3 is capable of being controlled independently regardless of any establishment of PLA 2.

4 Claims, 3 Drawing Sheets

PLA DAC CIRCUIT EMPLOYING A TEST FUNCTION

BACKGROUND OF THE INVENTION

The present invention relates to a digital-analog conversion (DAC) circuit equipped with a programmable logic array (PLA). More to particularly the present invention relates to a digital-analog conversion (DAC) circuit equipped with a programmable logic array (PLA) provided with a test-function.

DESCRIPTON OF THE RELATED ART

Conventionally, in a digital-analog conversion circuit equipped with a programmable logic array (hereinafter calling PLA DAC circuit), there is provided PLA and a plurality of current sources and switch circuit. The PLA DAC circuit outputs a characteristic of the DAC which is corresponding to the selected PLA. A test of an output characteristic of the DAC is implemented in an only part which is established by the PLA.

FIG. 1 is a circuit diagram showing a conventional example of a PLA DAC circuit. As shown in FIG. 1, the PLA DAC circuit is composed of MOS-transistors Q21–Q23, Q31–Q33, and Q41–Q43 which are taken the form of matrix. A program logic array (PLA) 2 is controlled by each digital signal of input terminals (STG1–STG3) IN. A constant current source circuit 6 provides constant currents I1–I3 (current ratio of I1, I2, I3 is set to 4:2:1) which are selected by N-channel MOS-transistors Q21–Q23, Q31–Q33, and Q41–Q43. A switching circuit 4 consisting of NPN-transistors Q11–Q13 outputs analog output current converted by the PLA 2, with the analog output current changed to output terminal OUT. Voltages V1 and V2 (V2>V1) of constant voltage sources are provided for the switching circuit 4 and the PLA 2. A current control load circuit 3 for controlling an output characteristic by the analog output current is connected to the output terminal OUT.

Each N-MOS of the PLA 2 performs a role of ROM-switch for controlling current supplied to the current control load circuit 3 in answer to method of source connection. The N-MOS is formed to select a characteristic established by the PLA 2 based on input signal from the input terminals STG 1–STG 3. Input of the input terminals STG 1–STG 3 is established such that only any one of the input thereof comes into "high" for selecting a stage of the PLA 2. Namely, a plurality of the establishments of PLA 2 are possible. The establishment is selected by the stage.

Now, it considers only the input terminal STG 1 to be "high" and other STG 2 and STG 3 to be "low". At this time, in the PLA 2, since the STG 2 and STG 3 are "low", the N-MOS Q31–Q33 and Q41–Q43 are off states, so that the current supplied to the current control load circuit 3 is not affected. Since the STG 1 is "high", the N-MOS Q21–Q23 are on states. Current from the constant current source I1 of the constant current source circuit 6 is provided for the current control load circuit 3 through the NPN Q11 because source of the N-MOS Q21 is open (illustrated as white dot). While source of the N-MOS Q22 is connected to emitter of the NPN Q12, and drain thereof is connected to the voltage source V2. And that since voltage of the voltage source V2 is established to be higher voltage than voltage of the voltage source V1, emitter voltage of the NPN Q12 is higher than base voltage thereof. For this reason, the NPN Q12 comes into off state. Current of the current source I2 is not provided for the current control load circuit 3 through the NPN Q12. Current flows from the voltage source V2 through the N-MOS Q22. Similarly, the N-MOS Q23 is on state. The drain thereof is connected to the voltage source V2 and the source thereof is connected to the emitter of the NPN Q13, so that the NPN Q13 comes into off state. Consequently, current of the current source I3 flows from the voltage source V2 through the N-MOS Q23.

Thus, when the input terminal STG 1 is "high", current supplied to the current control load circuit 3 is selected by the following method. The N-MOS Q21–Q23 select the current sources I1–I3. The current source I1 is selected in such a way that a current source in which each source of the N-MOSs Q21–Q22 which select the current sources I1–I3 each is not connected to emitter of the NPN Q11–Q13, thus in this case only I1 is selected to be provided. Also when the input terminal STG 2 and STG 3 are selected each, the same operation is implemented as that of the STG 1. In case of STG2, current from the current source I1 is provided for the current control load circuit 3. In case of STG3, current from the current source I2 is provided for the current control load circuit 3. When it permits a plurality of current sources to be selected by one input terminal, each current of the plurality of current sources are selected to be added, thus being provided for the current control load circuit 3.

The upshot is that due to connection method of source of the N-MOS Q21–Q23, Q31–Q33, and Q41–Q43 constituting the PLA 2, amplitude of current supplied to the current control load circuit 3 is capable of determining. There is provided both of the input terminal and switch circuit so as to select a plurality of selecting methods, thereby a total current to be provided is capable of being selected from the outer section, so that output characteristic of the PLA DAC section is capable of being controlled from the outer section.

By virtue of the fact that there is provided circuit including a PLA DAC, outer control of output characteristic using PLA DAC circuit is capable of possible. Consequently, when output characteristic is changed in the same circuit, it is capable of being changed by change of only control signal. It is not required changing of outer parts, and applying of outer adjustment, so that it can be used for many kinds of uses. By change of only PLA parts, it is capable of being granted in answer to many kinds of requirements. With respect to characteristic which requires accuracy, since characteristic is capable of being changed by one bit-accuracy, it causes requirement of accuracy to be satisfied.

However, above-stated conventional PLA DAC circuit, in spite of the fact that arrangement of each current source, switch element and so forth are identical, an output characteristic presents fully different value depending on method of establishment of PLA. Thereby there is the defect that when characteristics inspection is implemented using a PLA DAC circuit, inspection standard in answer to set of PLA should be established. In a PLA DAC circuit, when bit which is not used exists, a characteristic of the bit should be established to actual use condition in the PLA. There is the defect that it can not make a survey until output characteristic is evaluated.

SUMMARY OF THE INVENTION

In view of the foregoing, it is an object of the present invention to provide a PLA DAC circuit which makes possible output of output characteristic independent of such establishment of PLA.

According to one aspect of the present invention, for achieving the above-mentioned object, there is provided a PLA DAC circuit including a programmable logic array whose each cell is specified by digital signal from input terminal, a current source circuit consisting of a plurality of current sources supplying current to the programmable logic array, and a first switching circuit for supplying analog signal converted by the programmable logic array to output terminal, wherein a current source to be used of said plurality of current sources can be selected and a plurality of current sources to be selected are capable of being established in the programmable logic array, the PLA DAC circuit comprising an input terminal to which test terminal is added, a logical operation circuit connected between the input terminal to which test terminal is added and the programmable logic array for taking combination logic of both of the digital signal and test signal, and a second switching circuit for selecting the plurality of current sources in the current source circuit based on the test signal, wherein under the normal condition the programmable logic array implements digital-analog conversion thus outputting selected current, while under test mode it causes the second switching circuit to operate thus controlling the plurality of current sources each, before outputting current independent of establishment of the programmable logic array.

According to another aspect of the present invention there is provided a PLA DAC circuit in which logical operation circuit comprises a first AND-gate section for taking AND-logic of the digital signal and the test signal, and a second AND-gate section for outputting inverse logic in relation to the first AND-gate section, after taking AND-logic of the digital signal and the test signal, so that it causes either the programmable logic array or the second switching circuit to drive in accordance with respective output.

According to another aspect of the present invention there is provided a PLA DAC circuit in which logical operation circuit comprises a first AND-gate section for taking AND-logic of the digital signal and the test signal, and a second AND-gate section for outputting inverse logic in relation to the first AND-gate section, after taking AND-logic of the digital signal and the test signal, so that it causes either the programmable logic array or the second switching circuit to drive in accordance with respective output.

According to another aspect of the present invention, there is provided a PLA DAC circuit in which the second switching circuit is composed of MOS transistors corresponding to the plurality of current sources respectively, and it permits each MOS transistor to control by combination between the digital signal and the test signal, thus selecting the plurality of current sources, while it renders the second switching circuit functioning during test mode of no effect to characteristics of the programmable logic array of normal condition.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENTS

A preferred embodiment of the present invention will now be described in detail referring to accompanying drawings.

Figure 2:
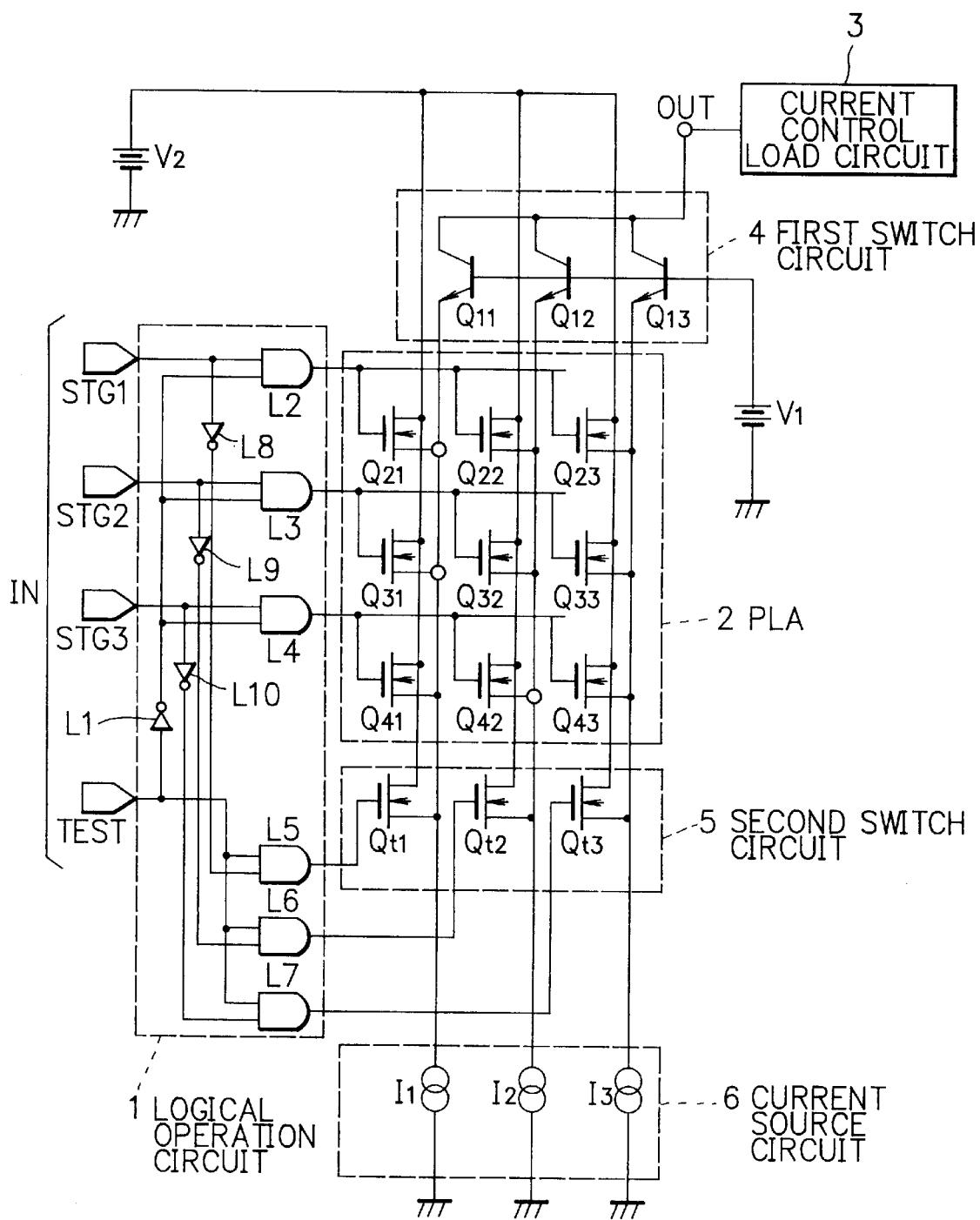
FIG. 2 is a circuit diagram showing a PLA DAC circuit according to one embodiment of the present invention.

FIG. 2 is a circuit diagram of a PLA DAC circuit for explaining one embodiment of the present invention. As shown in FIG. 2, in the PLA DAC circuit of the embodiment, a test-mode is newly provided therewith. When the test mode comes into effect, the normal PLA is canceled so that an output independent of the establishment procedure of the PLA is made possible. In this PLA DAC circuit, a test terminal is added to input terminals (STG1–STG3, and TEST) IN. A logical operation circuit 1 which is composed of inverters L1 and L8–L10, AND-gates L2–L4 and L5–L7, obtains a logical combination of both of a digital input signal and a test signal. Q21–Q23, Q31–Q33 and Q41–Q43 are the N-MOS. The PLA 2 is controlled in such a way that it permits each cell to be specified by output of the AND-gate L2–L4 of the logical operation circuit 1. A current source circuit 6 is provided with a plurality of current sources I1–I3 for supplying current to the PLA 2. Q11–Q13 are NPN. Namely, the PLA DAC circuit comprises the input terminal IN, the logical operation circuit 1, the PLA 2, the current source circuit 6, and the NPN Q11–Q13. A first switch circuit 4 provides analog signal converted by the PLA 2 for output terminal OUT. A current control load circuit 3 connected to the output terminal OUT controls output current characteristic. Qt1–Qt3 are the N-MOSs. A second switch circuit 5 selects a plurality of current sources I1–I3 within the current source circuit 6 based on the test signal, thus supplying to the PLA 2. Thus the PLA DAC circuit further comprises the first switch circuit 4, the current control load circuit 3, the N-MOS Qt1–Qt3, and the second switch circuit 5. The PLA 2 selects to establish the current source to be used actually out of the plurality of current sources I1–I3. When the PLA 2 establishes the current source, in the normal condition, the PLA 2 implements the normal digital-analog conversion, thus outputting the selected current, while in the test mode condition, it permits the second switch circuit 5 to operate so that each of the plurality of current sources I1–I3 is controlled, thus outputting the current independent of the establishment of PLA 2.

In particular, in the logical operation circuit 1, a first AND-gate section consists of AND gates L2–L4 taking digital signal and AND-logic of test inversion signal. L5–L7 are AND-gates. A second AND-gate section takes an AND-logic of digital signal and a test inversion signal, and outputs a logic which is contrary to that of the first AND gate. Namely the logical operation circuit 1 comprises the first AND-gate section and the second AND-gate section. The logic operational circuit 1 drives the PLA 2 and the second switch circuit 5 by the outputs of the first AND-gate section and the second AND-gate section. The second switch circuit 5 is composed of the N-MOS Qt1–Qt3 corresponding to the plurality of current sources I1–I3 each, thus controlling each MOS by the digital signal and a combination of the test signals, before selecting the plurality of current sources I1–I3. The second switch circuit 5 which functions only in case of test mode, does not affect the characteristic of the PLA 2 of the normal condition.

Under the circumstances, the current control load circuit 3 is a load circuit in which the characteristic is controlled by the current. Constant-current sources I1–I3 are provided in order to supply current to the load circuit. A current ratio of the constant-current sources I1–I3 is established to 4:2:1 which is the same current ratio as above conventional example as shown in FIG. 2. The first switch circuit 4 which is composed of NPN Q11–Q13 achieves a role of a switch supplying the current from the current source circuit 6 to the load circuit 3. Collector of each transistor is connected to an output terminal OUT, base thereof is connected to a voltage source V1, and emitter thereof is connected to the constant-current source I1–I3. The N-MOS Q21–Q23, Q31–Q33, Q41–Q43 and Qt1–Qt3 which constitute the PLA 2 and the second switch circuit 5 are transistors selecting the use of the current sources. Each drain thereof is commonly connected to the voltage sources V2 (V2>V1).

STG1–STG3 of the input terminals are input terminals which select the established PLA 2. "High" is applied to one of any input terminals. TEST is an input terminal for test mode establishment.

For example, when one mode is established by the N-MOS Q21–Q23, in order to select this mode, the STG1 and the TEST signal are judged by both of the inverter L1 and AND-gate L2 in the logical operation circuit 1. A logical combined signal is supplied to a gate of the N-MOS Q21–Q23. Sources of those N-MOS Q21–Q23 are connected to disconnection (white dot) or emitters of the NPN Q11–Q13 in answer to the use of the each current source I1–I3. Besides, the STG2 and the STG3 are connected in the same way as that of the STG1.

On the other hand, the N-MOS Qt1–Qt3 are the transistors which function in the test mode state. Each source is connected to the constant-current sources I1–I3. The logical combination signal is input to each gate of these N-MOSs from the terminal of the STG1–STG3 and the TEST-terminal through the AND-gates L5–L7 and the inverters L8–L10.

Next, operation of the PLA DAC circuit will be explained more concretely.

When the TEST-terminal is "low", in the terminals STG1–STG3 of the input terminals, there is input such that one of any terminals becomes "high". Here the terminal STG1 is taken to be "high", and the terminals STG2 and STG3 are taken to be "low". Under the condition, the gate of the N-MOS Q31–Q33 and Q41–Q43 of the PLA 2 become low, with the result that these transistors become off state. Since the TEST terminal is "low", the N-MOSs Qt1–Qt3 which constitute the second switch circuit 5 become off state. Consequently, these N-MOSs Q31–Q33, Q41–Q43, and N-MOSs Qt1–Qt3 do not affect the current which is supplied to the load circuit 3.

In the meanwhile, since the input terminal STG1 is "high", the gates of the N-MOSs Q21–Q23 are "high". Each transistor is on state. On the other hand, the source of the N-MOS Q21 is open, and the N-MOS Q41 and Qt1 which are connected to the current source I1 are off states, the current of the current source I1 is supplied to load circuit 3 through the NPN Q11. The N-MOS Q22 is on state because the source of the N-MOS Q22 is connected both to the emitter of the NPN Q12 and the current source I2. Since the drain of the N-MOS Q22 is connected to the voltage source V2, emitter voltage of the NPN Q12 becomes voltage of the voltage source V2. Namely, base voltage of the NPN Q12 is the voltage of the voltage source V1. Emitter voltage thereof is the voltage of the voltage source V2. Since Each voltage is established as the voltage source V2>the voltage source V1, the emitter voltage of the NPN Q12 becomes high rather than the base voltage, thus becoming off state. For this reason, the current of the current source I2 is not provided to the load circuit 3 through the NPN Q12. The current flows from the voltage source V2 through the NPN Q22.

Furthermore, also the gate of the N-MOS Q23 is "high", the N-MOS Q23 is on state. The drain of the N-MOS Q23 is connected to the voltage source V2 and the source thereof is connected to the emitter of the NPN Q13, thereby the emitter voltage of the NPN Q13 becomes the voltage of the voltage source V2. The base voltage of the NPN Q13 is the voltage of the voltage source V1. The emitter voltage thereof is the voltage of the voltage source V2. Each voltage source is established as the voltage source V2>the voltage source V1. Thereby the NPN Q13 becomes off state. As a result, the current of the current source I3 is not provided to the load circuit 3 through the NPN Q13, but flowing from the voltage source V2 through the N-MOS Q23.

As stated above, it is clear that when the input terminal STG1 is "high", the current of the current source I1 is supplied to the load circuit 3.

Moreover, each of the input terminals STG2 and STG3, it is the same condition as that of STG1. The current of each of the current sources I2 and I3 is supplied to the load circuit 3. When a plurality of current sources are selected at one stage, the current which is obtained in such a way that each current of the selected current sources are added is supplied to the load circuit 3.

Next, it is considered that when the TEST terminal is "high". When the TEST terminal is high, each gate of the N-MOSs Q21–Q23, Q31–Q33, and Q41–Q43 which constitute the PLA 2 become "low", thereby each N-MOS becomes off state. Consequently, these N-MOSs which function normally do not affect the current supplied to the load circuit 3.

On the other hand, "low" or "high" is input to the input terminals STG1–STG2 in answer to the current source to be used. For example, when the STG1 is "high", and the STG2 and STG3 are "low", the N-MOS Qt1 constituting the second switch circuit 5 becomes off state, because the gate becomes "low". Since the N-MOS Qt1 is off state, the current of the current source I1 is supplied to the load circuit 3 through the NPN Q11. The N-MOS Qt2 is on state. The drain thereof is connected to the voltage source V2. The source thereof is connected to the emitter of the NPN Q12. Thereby, the emitter voltage of the NPN Q12 becomes the voltage of the voltage source V2. Furthermore, although the base of the NPN Q12 is connected to the voltage source V1, since the voltage sources are established as the voltage source V2>the voltage source V1, the emitter voltage of the NPN Q12 becomes high rather than the base voltage, thus coming into off state. Consequently, the current of the current source I2 is not provided to the load circuit 3 through the NPN Q12, but flowing from the voltage source V2 through the N-MOS Qt2.

Similarly, the drain of the N-MOS Qt3 is connected to the voltage source V2, and the source thereof is connected to the emitter of the NPN Q13, thereby the base voltage of the NPN Q13 comes into the voltage of the voltage source V1. The emitter voltage of the NPN Q13 comes into the voltage of the voltage source V2. However, the voltage source is established according to the voltage source V2>the voltage source V1. The base voltage of the NPN Q13 becomes low rather than the emitter voltage of the NPN Q13, thus coming into off state. Consequently, the current of the current source I3 is not provided to the load circuit 3 through the NPN Q13, but flowing from the voltage source V2 through the N-MOS Qt3.

As stated above, when the input terminal STG1 is "high", while STG2 and STG3 are "low", only the current from the current source I1 is supplied to the load circuit 3.

When STG1 and STG3 are "low", while STG2 is "high", only the current from the current source I2 is supplied to the load circuit 3. When STG1 and STG2 are "low", while STG3 is "high", only the current from the current source I3 is supplied to the load circuit 3.

Figure 1:
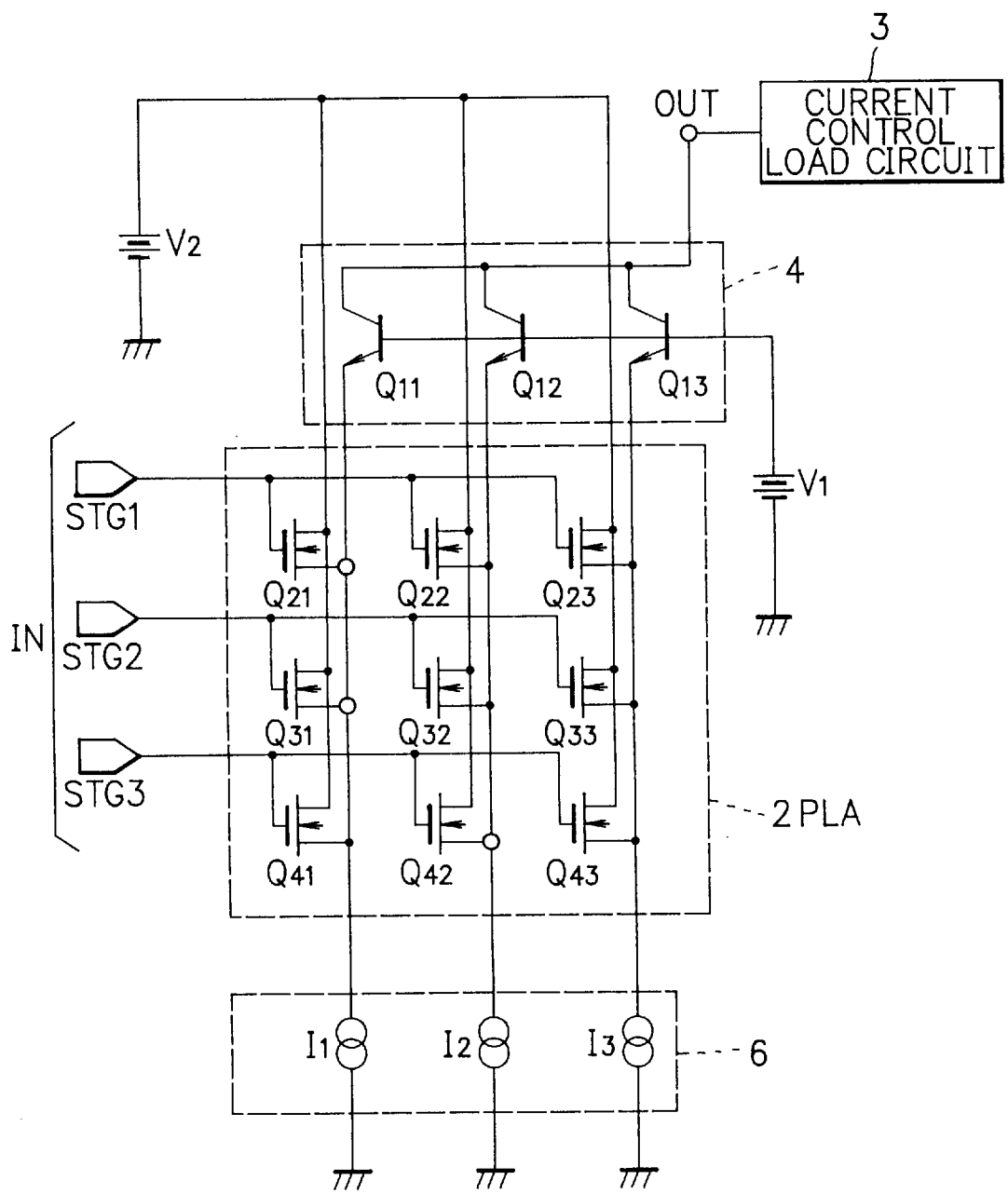
FIG. 1 is a circuit diagram showing a conventional PLA·DAC circuit.

Here, in the prior art of FIG. 1, since the current of the current source I3 corresponding bit 3 is not used, output to the load circuit 3 is incapable of being performed. According to the embodiment, there is provided the TEST terminal and causing the TEST terminal to be "high", and causing the STG1 and STG2 to be "low" and causing the STG3 to be "high", thereby supplying the output of the current source I3 to the load circuit 3 is capable of being possible.

Figure 3:
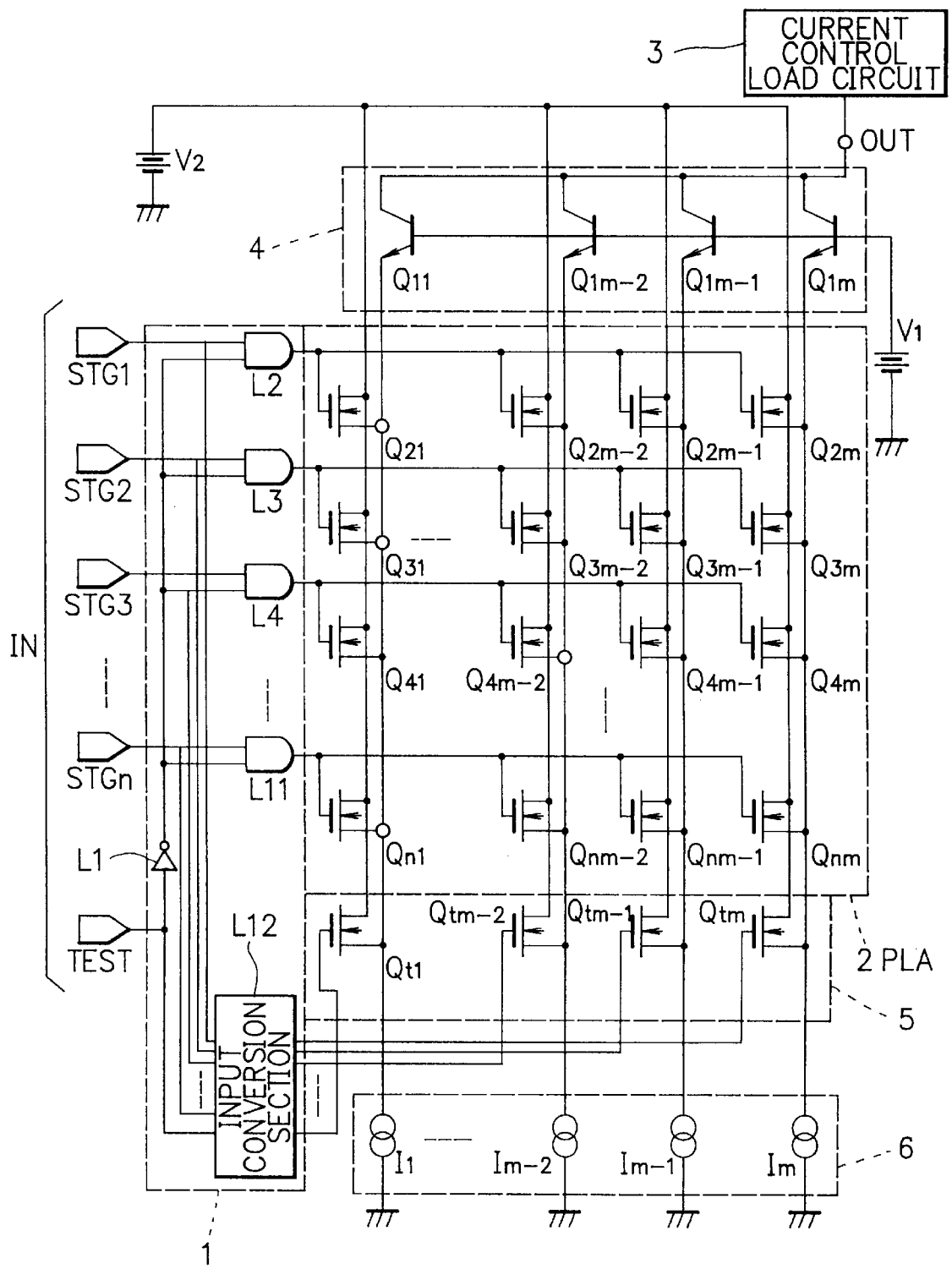
FIG. 3 is a circuit diagram showing a PLA DAC circuit according to another embodiment of the present invention.

FIG. 3 is a circuit diagram of PLA DAC for explaining another embodiment according to the present invention. As shown in FIG. 3, the PLA DAC circuit diagram according to the embodiment is the case where the DAC circuit of FIG. 2 described above is enlarged into the general circuit, and selected stage of the PLA is n, the input terminal for selecting them is n, meanwhile constant current source is m. The PLA DAC circuit supplies current to the load circuit 3 connected to the output terminal OUT. A total m constant current sources I1, . . . , Im−2, Im−1, Im constituting the current source circuit 6 are connected to the PLA·DAC circuit. Current ratio of these m constant current sources I1, . . . , Im−2, Im−1, Im are established to 1: . . . :$2^{(3-m)}$:$2^{(2-m)}$:$2^{(1-m)}$. A total m NPN-transistors Q11, . . . , Q1m−2, Q1m−1, Q1m constituting the first switch circuit 4 perform a role of switch in case of supplying current to the load circuit 3 from the constant current sources. Each collector is connected to the load circuit 3. Each base is connected to the voltage source V1. Each emitter is connected to m constant current sources I1, . . . , Im−2, Im−1, Im. Similarly, N-MOS Q21–Q2m, Q31–Q3m, Q41–Q4m, . . . , Qn1–Qnm constituting the PLA 2, and N-MOS Qt1–Qtm constituting the second switch circuit 5 are MOS-transistors which select the use of the current source. Each drain thereof is connected to the constant voltage source V2 (V2>voltage source V1).

Input terminals STG1–STGn select the PLA 2 which is established. Under the normal state, "high" is applied to any one of the input terminals STG1–STGn. When the test mode is established, "high" is applied to the input terminal TEST. Logic operation circuit 1 is connected between these input terminals and the PLA 2. The logic operation circuit 1 comprises an inverter L1 connected to the TEST terminal, AND-gates L2–L11 taking AND-logic of both of the input terminals STG1–STGn and output of the inverter L1, and an input conversion section L12 for taking logical combination of both of the input terminals STGL–STGn and the TEST terminal before specifying each transistor of the second switch circuit 5. More to particularly, the input conversion section L12 is composed of a shift resistor, a counter and so forth. The input conversion section L12 is logic operation circuit section having a total m outputs in answer to a total n+1 inputs.

In the PLA 2, one mode is established by the N-MOSs Q21–Q2m. In order to select this mode, signal that it permits input of STG1 and the TEST signal to logic-combine at the inverter L1 and the AND-gate L2 is supplied to the gate of each of the N-MOS Q21–Q2m. The sources of these N-MOS Q21–Q2m are connected to disconnection or the emitters of the NPN Q1–Qm constituting the first switch circuit 4 in answer to the use of each of the current sources I1–Im. The contents of the STG2–STGn are the same as that of the STG1.

On the other hand, the N-MOS Qt1–Qtm constituting the second switch circuit 5 are transistors functioning in case of the test mode. Each source thereof is connected to each of the constant current sources I1–Im. The signal output from the input conversion section L12 of the logic operation circuit 1 is input to each gate thereof.

Operation of the PLA DAC circuit described above is the same as that of the circuit shown in FIG. 2 under the normal state (TEST terminal is "low"). For example, when only the STG1 is "high", only current from the constant current source I1 is supplied to load circuit 3. On the other hand, in the test condition (the TEST terminal is "high"), each gate of the N-MOS Q21–Q2m, Q31–Q3m, . . . , Qn1–Qnm functioning under the normal state comes into "low". Thereby each MOS transistor of the PLA 2 becomes off state, thus affecting no influence to the current supplied to the load circuit 3. In the test condition, the gate of each of the N-MOS Qt1–Qtm of the second switch circuit 5 is determined by the output of the input conversion section L12. Namely, the current of the constant current source connected to the transistor which "low" is applied to the gate is supplied to the load circuit 3. Output of the input conversion section L12 is determined by input of the STG1–STGn. Output characteristic under the test mode is capable of being determined independently due to the method of constituting of the input conversion section L12 regardless of method of establishment of the PLA 2.

As stated above, the PLA DAC circuit according to the present invention, comprises the test terminal, the logic operational circuit, and the second switch circuit functioning under the test condition. Thereby current supply to the load circuit regardless of the method of establishment of the PLA is capable of possible. There is the effect that characteristic regardless of the PLA is capable of being output.

Conventionally, the bit can not be output. However, in the present invention the bit can be output without establishing the characteristic of the bit in the PLA. Thereby inspection standard which had been changed in answer to the PLA is capable of being standardized. There is the effect that both of shortening of inspection time and diminishing of time unit of inspection are capable of being realized.

When it permits new circuit whose PLA is changed to be designed, the design is capable of being implemented referring to the surveyed value, thereby there is the effect that the design can be performed accurately rather than conventional design.

While preferred embodiments of the invention have been described using specific terms, such description is for illustrative purpose only, and it is to be understood that changes and variations may be made without departing from the spirit or scope of the following claims.

What is claimed is:

1. A PLA DAC circuit including a programmable logic array whose each cell is specified by digital signal from input terminal, a current source circuit consisting of a plurality of current sources supplying current to said programmable logic array, and a first switch circuit for supplying analog signal converted by said programmable logic array to output terminal, wherein a current source to be used of said plurality of current sources can be selected and a plurality of current sources to be selected are capable of being established in said programmable logic array, said PLA DAC circuit comprising:

an input terminal to which test terminal is added;
a logical operation circuit connected between said input terminal to which test terminal is added and said programmable logic array for taking logical combination of both of said digital signal and test signal; and
a second switch circuit for selecting said plurality of current sources in said current source circuit based on said test signal, wherein under the normal condition said programmable logic array implements digital-analog conversion thus outputting selected current, while under test mode it permits said second switch circuit to be operated thus controlling said plurality of current sources each, before outputting current independent of establishment of said programmable logic array.

2. A PLA DAC circuit according to claim 1, wherein said logical operation circuit comprises a first AND-gate section for taking AND-logic of said digital signal and said test signal, and a second AND-gate section for outputting inverse logic in relation to said first AND-gate section, after taking AND-logic of said digital signal and said test signal, so that it permits either said programmable logic array or said second switch circuit to drive in accordance with respective output.

3. A PLA DAC circuit according to claim 1, wherein said second switch circuit is composed of MOS transistors corresponding to said plurality of current sources respectively, and it permits each MOS transistor to be controlled by combination between said digital signal and said test signal, thus selecting said plurality of current sources, while it renders said second switch circuit functioning during test mode of no effect to characteristics of said programmable logic array of normal condition.

4. A converter comprising an output terminal, a plurality of current sources, a programmable logic array coupled to said output terminal and said current sources and supplied with a set of input signals and a test signal, said programmable logic array being brought by a first level of said test signal into a normal operation in which one of said current sources selected by first information programmed therein and second information of said input signals is electrically coupled to said output terminal and by a second level of said test signal into a test operation in which one of said current sources selected by said second information is electrically coupled to said output terminal irrespective of said first information.

* * * * *